(12) United States Patent
Kasai

(10) Patent No.: US 8,005,352 B2
(45) Date of Patent: Aug. 23, 2011

(54) HEAT TREATING DEVICE

(75) Inventor: Shigeru Kasai, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 757 days.

(21) Appl. No.: 11/993,223

(22) PCT Filed: Jun. 21, 2006

(86) PCT No.: PCT/JP2006/312411
§ 371 (c)(1),
(2), (4) Date: Dec. 20, 2007

(87) PCT Pub. No.: WO2006/137439
PCT Pub. Date: Dec. 28, 2006

(65) Prior Publication Data
US 2010/0150534 A1  Jun. 17, 2010

(30) Foreign Application Priority Data
Jun. 21, 2005 (JP) .................... 2005-180353

(51) Int. Cl.
*F21V 7/00* (2006.01)
(52) U.S. Cl. ........ 392/426; 392/407; 392/416; 392/419; 392/420

(58) Field of Classification Search .................. 392/416, 392/407, 419, 420, 426
See application file for complete search history.

(56) References Cited

U.S. PATENT DOCUMENTS
6,636,308 B1  10/2003  Tsutsui et al.

FOREIGN PATENT DOCUMENTS
| | | |
|---|---|---|
| CN | 1279763 A | 1/2001 |
| JP | 4 297581 | 10/1992 |
| JP | 7 201753 | 8/1995 |
| JP | 7 245274 | 9/1995 |

*Primary Examiner* — Thor S Campbell
(74) *Attorney, Agent, or Firm* — Oblon, Spivak, McClelland, Maier & Neustadt, L.L.P.

(57) ABSTRACT

A heat treating device including a treatment room for accommodating therein a substrate, a plurality of light sources, which is disposed above the treatment room, for irradiating the substrate, a first reflector, whose inner surface is a reflective surface of a dome shape, for reflecting and directing a part of light emitted from each light source to the substrate, and a plurality of second reflectors, each of which is provided for each light source, for reflecting and focusing light emitted from each light source and directing it to the substrate. The reflective surface of each of the second reflectors is a part of a spheroidal surface or a curved surface approximate to it surrounding a first focal point in such a manner that the first focal point is formed at a position near each light source and a second focal point is formed on a side of the substrate.

6 Claims, 3 Drawing Sheets

HEAT TREATING DEVICE

FIELD OF THE INVENTION

The present invention relates to a heat treating device for performing a heat treatment on a substrate such as a silicon wafer or the like by irradiating light thereto.

BACKGROUND OF THE INVENTION

In a manufacturing process of semiconductor devices, various heat treatment processes such as film forming, pattern etching, oxidation and diffusion, quality modification, annealing and the like are repeatedly performed. As a heat treating device for performing a specified heat treatment on a substrate such as a silicon wafer at a high temperature greater than or equal to 400° C. in a short period of time as possible, a rapid heating device (lamp annealing device) which rapidly heats the substrate by irradiating light from a light source thereto has been used (see, for example, Japanese Patent Laid-open Publication No. 2005-101237, Japanese Patent Laid-open Publication No. 2001-237195, Japanese Utility Model No. 3017978 and Japanese Patent Laid-open Publication No. H07-29843).

A heat treating device disclosed in Japanese Patent Laid-open Publication No. 2005-101237 includes a plurality of light sources attached to substantially an entire bottom surface of a ceiling portion of a lamp housing, which serves as a heating unit for rapidly heating a target object, e.g., a wafer. The bottom surface of the ceiling portion is a reflective surface formed of a planar surface or a cone surface, and a heat ray emitted from each light source is reflected towards the wafer located below. Further, the light sources located at the center portion of the lamp housing are disposed in such a manner that the radiation directions of the heat rays thereof point vertically downwards and the light sources located at the peripheral portion of the lamp housing are disposed so that the radiation direction of the heat rays thereof are tilted inwardly downwardly. In this way, the radiation directions of the heat rays are focused on the peripheral portion of the wafer.

A flash irradiation heating device disclosed in Japanese Patent Laid-open Publication No. 2001-237195 has a plurality of flash discharge lamps formed of straight pipes arranged in plural lines, which are installed above a work and in parallel with the work. Installed above the flash discharge lamp is a reflective mirror for reflecting flash from each flash discharge lamp downward. The reflective mirror is of a flat plate shape, and both end portions thereof are slightly bent downward at a predetermined angle.

In a beam heater disclosed in Japanese Utility Model No. 3017978, disposed in a lamp housing with a plurality of heat transfer holes in its peripheral portion is a reflective mirror of a hemispherical shape whose inner surface is a reflective surface. A halogen lamp is disposed inside the reflective mirror, and therefore, light emitted from the halogen lamp is reflected at the reflective surface and focused in a spot on a work disposed below.

In a heat treating device disclosed in Japanese Patent Laid-open Publication No. H07-29843, a plurality of light sources is disposed inside a lamp housing whose inner surface is a reflective surface of a dome shape (hemispherical shape), and light from the light sources is reflected downward by the reflective surface to be directed to a surface of a semiconductor wafer. As the light sources, a plurality of ring-shaped halogen lamps having different diameters or a plurality of bulb-type lamps as a point light source are used.

Meanwhile, if various heat treatment processes such as film forming, pattern etching, oxidation and diffusion, quality modification, annealing and the like are performed in the manufacturing process of the semiconductor devices, the surface of the substrate needs to be heated to a predetermined temperature in a short time. Further, the substrate is heated such that it has a uniform temperature distribution over the entire surface thereof.

However, the heat treating device disclosed in Japanese Patent Laid-open Publication No. 2005-101237 and the flash irradiation heating device disclosed in Japanese Patent Laid-open Publication No. 2001-237195 use a reflector whose reflective surface is of a planar surface or a cone surface. Therefore, it is difficult to collect light emitted from each light source in high density and direct the light to a predetermined position, and it is also difficult to uniformly heat the entire surface. In particular, it is extremely difficult to apply the devices to a substrate with a large diameter of, e.g., 300 mm.

To the contrary, the beam heater with a hemispheric reflective surface disclosed in Japanese Utility Model No. 3017978 and the heat treating device disclosed in Japanese Patent Laid-open Publication No. H07-29843 can have the uniform illumination distribution at the planar surface (bottom surface) of a hemispherical shape according to a solid angle projection theorem. Accordingly, the temperature can be uniformly distributed over the entire surface of the substrate. However, since the irradiation area becomes small if the substrate is disposed at the focal point of the reflector, the number of the light sources needs to be increased in order to irradiate the whole surface of the substrate. On the other hand, if the substrate is offset from the focal point, the larger area of the substrate can be irradiated, and therefore, the number of the light sources can be reduced. However, the intensity of the light is weak, resulting in decreased heating efficiency. Further, in the event that the intensity of the light emitted from the light source is increased by increasing an electric current flowing through the filament of the light source in order to enhance heating efficiency, the substrate can be rapidly heated, but there occurs a problem that the durability of the light source is reduced.

Therefore, various experiments have been performed with respect to the collection of the light. As a result, it has been found that the light emitted from the light source can be efficiently directed to the substrate by using a complex reflector including two types of reflectors and the substrate can be rapidly heated to a specific high temperature.

SUMMARY OF THE INVENTION

It is, therefore, an object of the present invention to provide a heat treating device capable of heating a substrate to a high temperature in a short time by focusing light emitted from a light source with low loss and high density.

In accordance with an aspect of the present invention, there is provided a heat treating device including: a treatment room for accommodating therein a substrate; a plurality of light sources, which is disposed above the treatment room, for irradiating the substrate; a first reflector, whose inner surface is a reflective surface of a dome shape, for reflecting and directing a part of light emitted from each light source to the substrate; and a plurality of second reflectors, each of which is provided for each light source, for reflecting and focusing light emitted from each light source and directing it to the substrate, wherein a reflective surface of each of the second reflectors is a part of a spheroidal surface or a curved surface approximate to it surrounding a first focal point in such a manner that the first focal point is formed at a position near each light source and a second focal point is formed on a side of the substrate.

In accordance with the present invention, a part of the light emitted from the light source is reflected by the reflective surface of the second reflector and is then irradiated to the surface of the substrate to be focused on the second focal point. Further, a part of direct light, which is emitted from the light source but does not reach the second reflector, is directly irradiated onto the surface of the substrate, while the other part of the direct light is reflected by the reflective surface of the first reflector to be irradiated on the surface of the substrate. In this manner, light loss is reduced and heating efficiency is improved, whereby the temperature of the substrate can be rapidly raised.

Preferably, the reflective surface of the first reflector is of a hemispherical shape and the light sources are disposed outside the reflective surface of the first reflector on the almost entire surface of the first reflector. In this case, the light sources form a heat generating light source of a hemispherical shape, and illumination distribution at the bottom surface of the light source of a hemispherical shape becomes uniform according to the solid angle projection theorem. Therefore, it is possible to realize heating with uniform temperature distribution, and therefore, the device can be applied to a substrate with a large diameter.

Preferably, the second reflectors are disposed at respective tilt angles adjusted with respect to an optical axis of the first reflector in such a manner that lights emitted from the respective light sources and then reflected by the reflective surfaces of the respective second reflectors are irradiated on respective specific irradiation areas of the substrate to be processed without crossing each other. In this case, the entire surface of the substrate can be uniformly heated with more ease.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE EMBODIMENTS

Hereinafter, an embodiment of the present invention will be described in detail with reference to the accompanying drawings.

Figure 1:
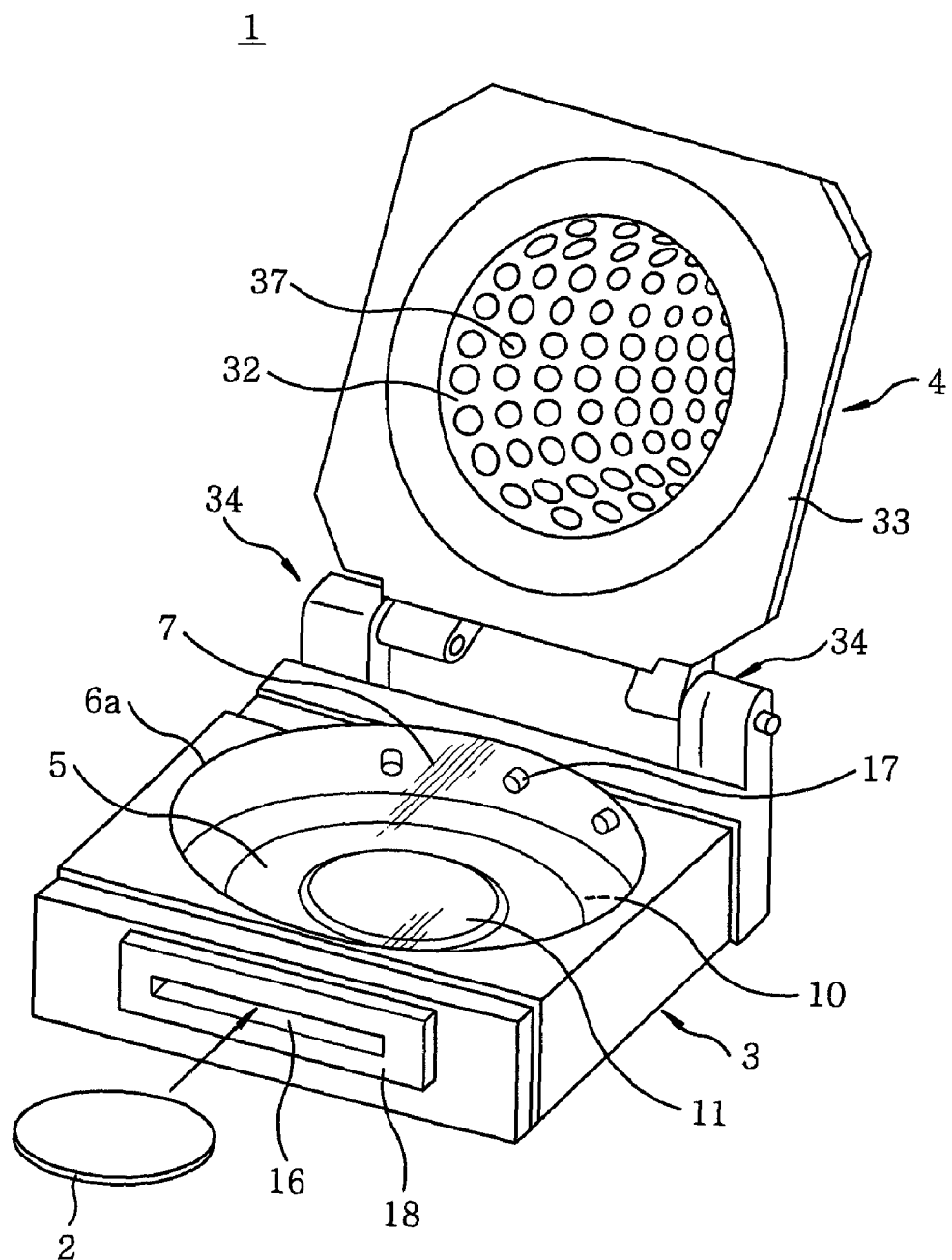
FIG. 1 is a schematic configuration of a heat treating device in accordance with an embodiment of the present invention.
Figure 2:
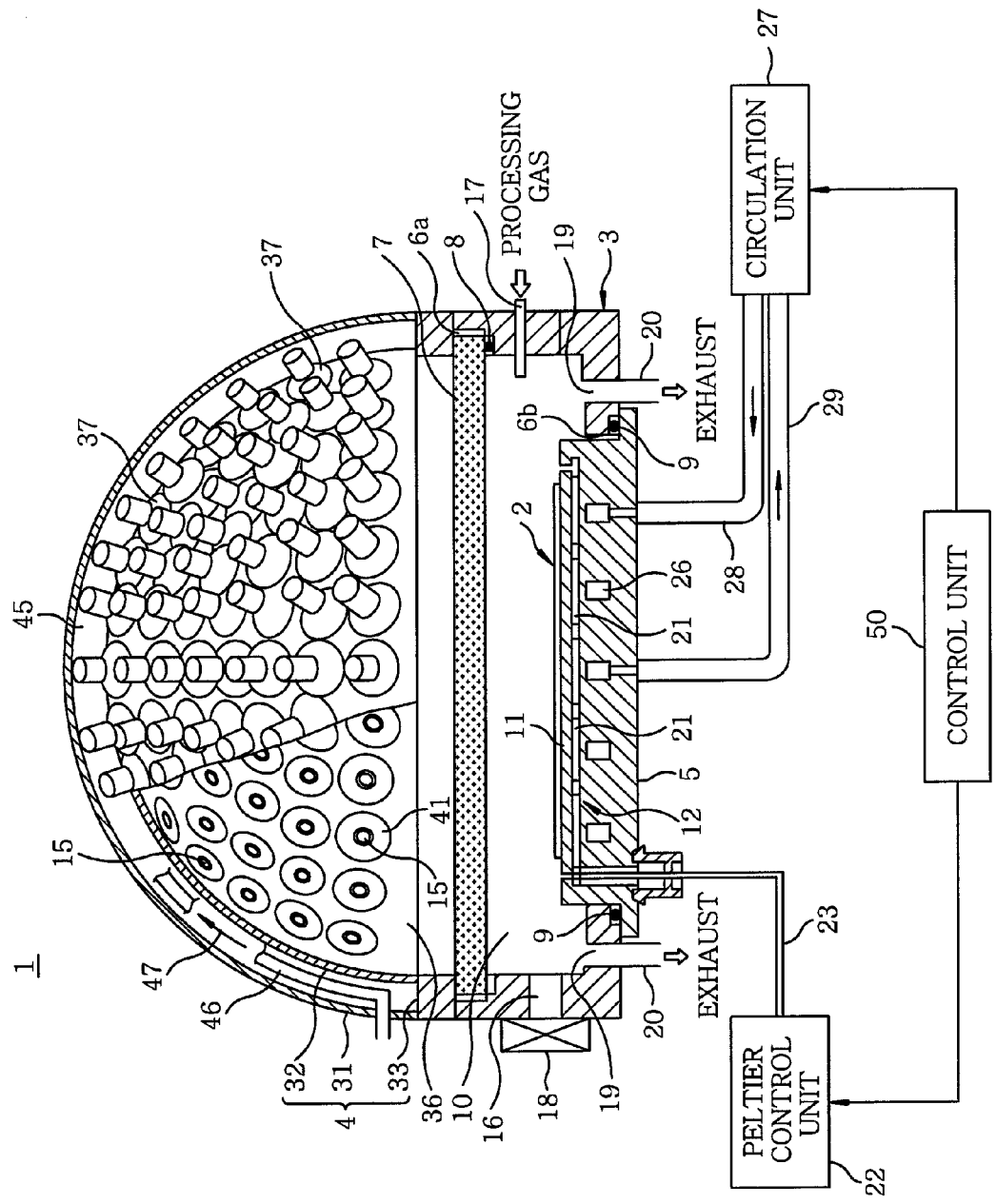
FIG. 2 is a cross sectional view of the heat treating device shown in FIG. 1.
Figure 3:
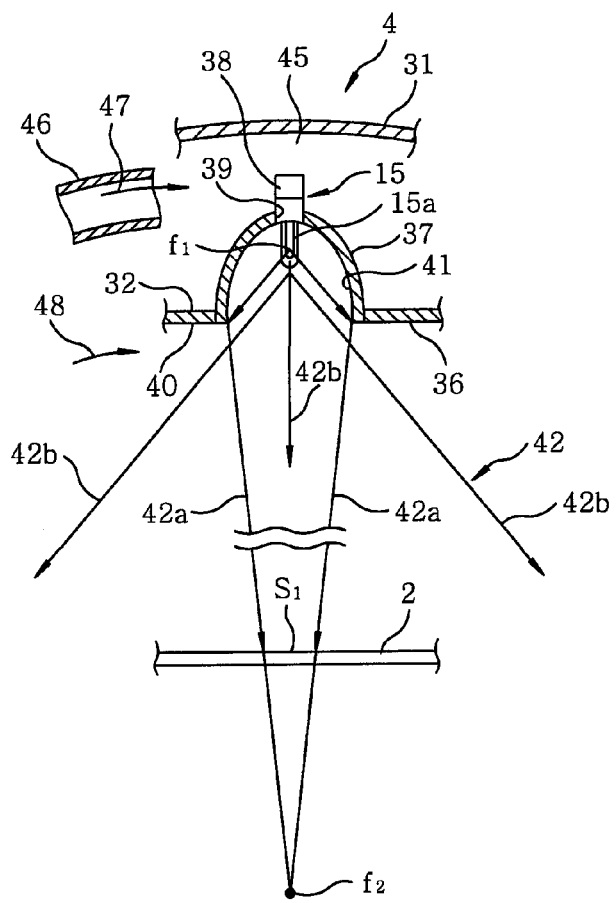
FIG. 3 illustrates the position relationship among a substrate, a light source and a focal point of a second reflector.
Figure 4:
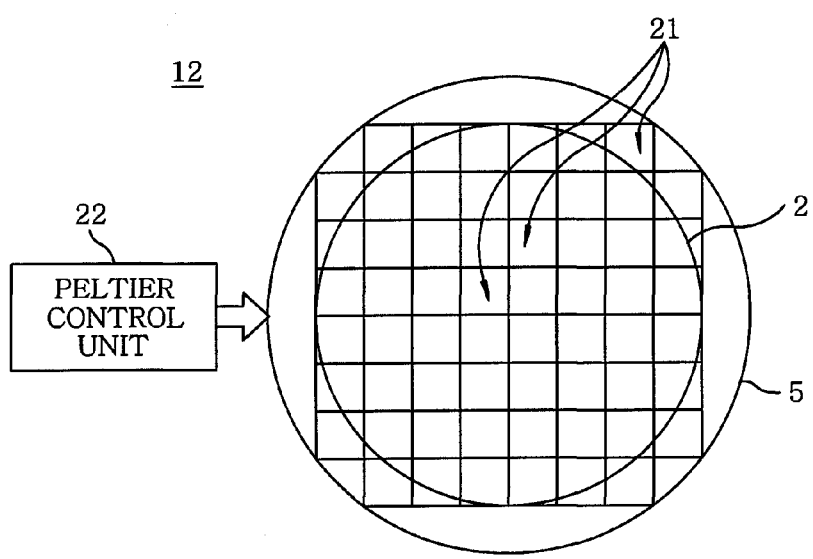
FIG. 4 shows an exemplary arrangement of peltier elements forming a thermoelectric conversion unit.

FIG. 1 is a schematic configuration of a heat treating device in accordance with the embodiment of the present invention. FIG. 2 is a cross sectional view of the heat treating device shown in FIG. 1. FIG. 3 illustrates the position relationship among a substrate, a light source and a focal point of a second reflector. FIG. 4 shows an exemplary arrangement of peltier elements forming a thermoelectric conversion unit.

As shown in FIGS. 1 to 4, the heat treating device 1 of this embodiment performs a lamp annealing in order to stabilize the atomic structure after ion-implanting impurity atoms into a channel layer of a transistor that is a semiconductor device. This heat treating device 1 needs to raise the temperature of a surface of a silicon wafer (hereinafter, referred to as a "substrate") 2 to a predetermined processing temperature required for ion activation, e.g., about 1000° C. to 1100° C., in a very short time, and further, it needs to rapidly lower the temperature of the substrate 2 to the original temperature after processing it. It is because, as the processing time is longer, the impurity atoms diffuse deeply into the substrate 2 to penetrate the rear side of the substrate 2, which results in defective products.

The heat treating device 1 includes a chamber (processing vessel) 3 accommodating therein the substrate 2 to be heat treated and a lamp housing 4 disposed above the chamber 3. The heat treating device 1 can perform a heat treatment on the substrate 2 having a diameter of 300 mm.

The chamber 3 made of aluminum has a box shape with an upper opening 6a and a lower opening 6b. The upper opening 6a is air-tightly sealed by a transparent member 7 and an O-ring 8. In the same manner, the lower opening 6b is air-tightly sealed by a bottom plate 5 and an O-ring 9. The material of the transparent member 7 may be varied depending on the type of a light source 15 serving as a heating unit used for the heat treatment of the substrate 2. For example, in case of using an infrared lamp, the transparent material with infrared transmission such as quartz or the like is used.

A treatment room 10 for heat treating the substrate 2 is formed inside the chamber 3. Installed in the treatment room 10 are a disc-shaped mounting table 11 on which the substrate 2 is mounted and an elevating mechanism (not shown) for elevating/lowering the substrate 2 with respect to the mounting table 11.

The mounting table 11 is disposed on a top surface of the bottom plate 5 via a thermoelectric conversion unit 12. The mounting table 11 is made of material which most easily absorbs light from the used light source 15. For example, if the light source 15 is an infrared lamp, the mounting table 11 is made of $SiO_2$ based material, AlN based material, SiC based material or the like which easily absorbs infrared light. If the light source 15 is an ultraviolet lamp or a halogen lamp, it is made of Ge based material, Si based material, metal material or the like which easily absorbs ultraviolet light.

For example, the elevating mechanism (not shown) may include a plurality of elevatable supporting pins extending through the mounting table 11 to support the bottom surface of the substrate 2 and a driving unit for vertically moving the supporting pins.

Further, installed through a sidewall of the chamber 3 are a substrate entrance 16 through which the substrate 2 is loaded and unloaded into and from the treatment room 10 and a gas nozzle 17 for introducing a processing gas needed for heat treatment of the substrate 2 into the treatment room 10. As the processing gas, $N_2$ or Ar gas with low chemical reactivity is used. The substrate entrance 16 is normally air-tightly sealed by a gate valve 18. The gas nozzle 17 is connected to a gas supply source (not shown). Furthermore, formed at a bottom portion of the chamber is a gas exhaust port 19. The gas exhaust port 19 is connected to a gas exhaust unit (not shown) through a gas exhaust pipe 20. In the heat treatment process of the substrate 2, air inside the treatment room 10 is exhausted by the gas exhaust unit and at the same time a processing gas is supplied from the gas supply source through the gas nozzle 17. That is, the air inside the treatment room 10 is substituted with the processing gas.

Further, a plurality of peltier elements 21 is used as the thermoelectric conversion unit 12. The peltier element 21 refers to an element in which different kinds of conductors or semiconductors are connected in series by an electrode and heat generation or heat absorption other than Joule heat occurs at the contact when an electric current flows therethrough. To be specific, the peltier element 21 can be formed of a Bismuth Telluride ($Bi_2Te_3$) having a temperature resistance up to 200° C., lead telluride (PbTe) or silicon germanium (SiGe) having a higher temperature resistance, or the like. The peltier element 21 is electrically connected to a peltier control unit 22 via a lead line 23. The peltier control unit 22 controls the direction and the amount of the electric current supplied to the peltier element 21 when heat treating the substrate 2.

FIG. 4 shows an example of the arrangement of the peltier elements 21. In the example of FIG. 4, for the substrate 2 having a diameter of 300 mm, sixty peltier elements 21 are arranged to completely cover an almost entire rear surface of the mounting table 11 with substantially no gap therebetween. By arranging the peltier elements 21 close to each other in this manner, the substrate 2 and the mounting table 11 can be more uniformly heated. The shape of the peltier element 21 is not limited to a square shape, and it may be of a circular or hexagonal shape. Herein, the thermoelectric conversion refers to converting thermal energy into electric energy or vice versa.

A heat transfer medium path 26 is formed inside the bottom plate 5 over the almost entire surface in a planar direction thereof. The heat transfer medium path 26 is installed below the thermoelectric conversion unit 12, and a cooling medium (water) serving as a heat transfer medium is supplied therethrough in case of lowering the temperature of the substrate 2. The cooling medium takes thermal energy from the bottom surfaces of the peltier elements 21 to cool them. Furthermore, in case of raising the temperature of the substrate 2, a heating medium is supplied, when necessary, to heat the bottom surfaces of the peltier elements 21 by taking cold heat therefrom. The heat transfer medium path 26 is connected to a circulation unit 27 supplying the heat transfer medium via a heat transfer medium inlet line 28 and a heat transfer medium discharge line 29, respectively. Thus, the circulation unit 27 circulates and supplies the heat transfer medium to the heat transfer medium path 26.

The lamp housing 4 includes an outer shell 31 and an inner shell 32 of a hemispherical shape opening downward, which are made of aluminum, and a ring-shaped supporting frame 33 supporting lower edges of the outer shell 31 and the inner shell 32. The supporting frame 33 is attached to the rear end of the upper surface of the chamber 3 through a hinge 34 in such a manner that it can be freely rotated in the forward/backward direction. Accordingly, an upper space of the transparent member 7 is air-tightly closed.

The inner shell 32 is of a hemispherical shape whose diameter is set to be a little smaller than that of the outer shell 31 but larger than that of the substrate 2. Further, an inner surface of the inner shell 32 forms a hemispherical reflective surface 36 and serves as a reflector (hereinafter, the inner shell 32 is referred to as a "first reflector"). The reflective surface 36 is coated with gold after being finished, so that it has high reflectivity.

Furthermore, a plurality of second reflectors 37 is integrally protruded from substantially the entire surface of the first reflector 32. The light source 15 is disposed in each second reflector 37.

As shown in FIGS. 1 and 3, the second reflector 37 is a part of a spheroid (a curved surface approximate to it) with two focal points $f_1$ and $f_2$, which is protruded outwardly from the first reflector 32. In other words, the second reflector 37 is of a hollow artillery shell shape (an approximate ogive shape).

Formed at a vertex of the second reflector 37 is a socket hole 39 for attaching a socket 38 of the light source 15. The open end of the second reflector 37 is coupled to the periphery of a hole 40 formed in the reflective surface 36 of the first reflector 32. Therefore, the inside of the second reflector 37 communicates with that of the first reflector 32.

The inner surface of the second reflector 37 is a reflective surface 41 coated with gold to have high reflectivity. The focal point $f_1$ of the two focal points $f_1$ and $f_2$ of the second reflector 37 is located inside the second reflector 37 and surrounded by the reflective surface 41. Furthermore, a filament 15a of the light source 15 is positioned at the first focal point $f_1$. Meanwhile, the second focal point $f_2$ is disposed on the same axis line as the second reflector 37, but positioned below the substrate 2 in the treatment room 10 of the chamber 3.

Therefore, the lights emitted from the respective light sources 15 and then reflected by the reflective surfaces 41 of the respective second reflectors 37 are irradiated on respective specific irradiation areas $S_1$ of the surface of the substrate 2 to be processed without crossing each other. Here, in order to make the whole surface temperature of the substrate 2 uniformly distributed, the tilt angle of each second reflector 37 with respect to an optical axis of the first reflector 32 is individually adjusted.

Further, the second focal point $f_2$ is preferably located on the side of the substrate 2 with respect to the first focal point $f_1$. Although FIG. 3 shows an example of the second focal point $f_2$ located below the substrate 2, the focal point $f_2$ is not limited thereto, and may be positioned above the substrate 2. For example, the second reflector 37 may be formed in such a manner that the focal point $f_2$ coincides with the sphere center of the first reflector 32.

As the light source 15 for heating the substrate 2 in the heat treatment process, it is preferable to use a bulb-type lamp formed of a substantial point light source which generates a heat ray having a wavelength of 1.17 μm or less. The reason for using the lamp generating the heat ray with a wavelength of 1.17 μm or less is because if the substrate 2 is a silicon wafer, heat ray absorptance of the silicon substrate depends on the wavelength of the heat ray and the temperature of the wafer itself. In other words, the heat ray with a wavelength of 1.17 μm or less has high absorptance from 0.5 to 0.7 regardless of the temperature of the silicon wafer, whereas if the wavelength is greater than 1.17 μm, absorptance highly depends on the temperature of the silicon wafer. That is, as the temperature of the silicon wafer is lowered, absorptance decreases (transmittance increases). For example, if the temperature of the silicon wafer varies in a range from 270° C. to 600° C., absorptance thereof varies in a range from 0.1 to 0.7. Accordingly, in order to rapidly raise the temperature of the substrate 2 composed of the silicon wafer, it is preferable to use a lamp which emits the heat ray having a wavelength of 1.17 μm or less, e.g., an ultraviolet lamp which mainly emits ultraviolet rays, a halogen lamp mainly emitting visible rays, an infrared lamp mainly emitting infrared light or the like. In the present specification, the heat ray refers to a broad range of light rays including ultraviolet rays and far infrared rays as described above.

Assuming the light source 15 as a point light source, reflected light 42a reflected by the reflective surface 41 of the second reflector 37 among the light 42 emitted from the light source 15 is focused on the second focal point $f_2$. However, since the light source 15 is actually not an ideal point light source, a part of the reflected light 42a which is emitted from the light source 15 and is then reflected by the reflective surface 41 is not focused on the second focal point $f_2$, but is irradiated to its around. Further, a part of direct light 42b which is emitted from the light source 15 but does not reach the reflective surface 41 is directly irradiated onto the surface of the substrate 2. On the other hand, the other part of the direct light 42*b* which is emitted from the light source 15 but does not reach the reflective surface 41 is reflected by the reflective surface 36 of the first reflector 32, and is then irradiated onto the surface of the substrate 2. Among the light irradiated to the substrate 2, the amount of the light absorbed by the substrate 2 is maximum 70%, and the rest of it is reflected or transmitted. Here, the light reflected by the substrate is again reflected by the reflective surface 36 of the first reflector 32 to be irradiated on the substrate 2. Furthermore, the light irradiated on the mounting table 11 or the bottom plate 5 among the direct light is lost. The amount of light loss can be maximally reduced by adjusting the size, the inclination, the opening diameter or the like of the second reflector 37.

The number of the light sources 15 is determined by the size of the substrate 2, the irradiation area $S_1$ of the substrate 2 irradiated by a single light source, a design criteria of a temperature increase rate of the substrate 2, the power of all light sources 15, the diameter of the first reflector 32, and the surface area of the reflective surface 37 and the like.

Hereinafter, a design process of the first reflector and the second reflector 37 will be described as an example. The configuration of the first reflector 32 and the second reflector 37 for a specific light source 15 can be determined in the following sequence.

First, the power of all light sources is calculated from the temperature increase rate of the substrate 2 which satisfies the process condition.

Next, the required number "n" of the light sources 15 is obtained by using the obtained power of all the light sources and the individual power of each light source 15.

Further, a radius "r" of the second reflector 37 is obtained from the size of each light source 15. The target surface area "S" of the first reflector 32 can be derived from Equation 1.

$$S = n\pi r^2 + \alpha \quad \text{Eq. 1}$$

where, $\alpha$ is a constant for compensating the area.

Meanwhile, if a radius of the first reflector 32 is R, the surface area S of the first reflector 32 can be expressed by Equation 2.

$$S = 2\pi R^2 \quad \text{Eq. 2}$$

From Equation 2, the radius R of the first reflector 32 can be represented by Equation 3.

$$R = \sqrt{\frac{S}{2\pi}} \quad \text{Eq. 3}$$

Here, although each condition is determined after the light source 15 is determined, but it may be determined from other conditions.

In this embodiment, 186 infrared lamps with a diameter of 15 mm are used for the substrate 2 having a diameter of 300 mm. The irradiation area $S_1$ of the substrate 2 irradiated by the light source 15 can be easily altered by vertically moving the substrate 2 to thereby change the distance to the light source 15.

An enclosed space 45 is formed between the outer shell 31 and the first reflector 32. A water cooling pipe 46 is provided in the enclosed space 45. The first and second reflectors 32 and 37 are water-cooled by supplying wafer 47 to the water cooling pipe 46, whereby the temperature of the lamp housing 4 is suppressed from being increased when the light sources 15 are turned on. Moreover, the inside of the first reflector 32 is air-cooled by air 48.

Hereinafter, a heat treatment operation performed on the substrate 2 by using the heat treating device 1 as configured above will be described.

First, by opening the gate valve 18 provided on the sidewall of the chamber 3, the substrate 2 to be processed is loaded into the treatment room 10 through the substrate entrance 16 and is then mounted on the mounting table 11. Subsequently, the gate valve 18 is closed to seal the chamber 3. After that, the treatment room 10 is vacuum-evacuated by the gas exhaust unit, and is then supplied with a processing gas from the gas supply source, whereby the chamber 3 is maintained at a specified processing pressure, e.g., at 100 Pa to 10000 Pa.

Next, an electric current is applied to each peltier element 21 of the thermoelectric conversion unit 12 in a direction to heat the top surface of each peltier element 21, thereby preliminary heating the substrate 2. The substrate is preliminarily heated at a temperature ranging from 500° C. to 600° C., where the impurities implanted in the substrate 2 do not diffuse.

The temperature of the substrate 2 is detected by a temperature sensor. If the temperature sensor detects that the temperature of the substrate 2 reaches a predetermined preliminary heating temperature, a detected signal is transmitted to a control unit 50 controlling the entire device. If receiving the detected signal, the control unit 50 turns all of the light sources 15 on to instantly raise the temperature of the surface of the substrate 2 to a predetermined processing temperature, e.g., 1000° C. by the heat rays therefrom. In this manner, a flash lamp annealing process is performed on the substrate 2.

The light irradiated by the above-mentioned flash lamp annealing process is stronger than that in case of successively turning the light sources 15 on. Accordingly, raising the temperature can be completed in a short time. Further, since activation of ions in the substrate 2 can be completed in a very short time, ions do not diffuse.

Further, the heat treating device 1 of the present embodiment uses a complex reflector including the first reflector 32 of a hemispherical shape and the second reflector 37 of a spheroid. Thus, the substrate 2 can be more efficiently heated than with the conventional device. That is, as described above, among the light emitted from the light source 15 to be irradiated to the substrate 2 (i.e. the light reflected by the first reflector 32, the light reflected by the second reflector 37 and the direct light from the light source 15), the amount of the light absorbed by the substrate 2 is maximum 70%, and the rest 30% is reflected or transmitted. Here, the light reflected by the substrate 2 is again reflected by the reflective surface 36 of the first reflector 32 and irradiated to the substrate 2. Therefore, the substrate 2 can be heated to a predetermined processing temperature in a short time with low light loss and without requiring large light emission output of the light source 15, which results in improved efficiency.

Further, in the annealing process of the substrate 2, if the light emission output of the light source 15 is controlled for each part of the substrate 2, e.g., if the substrate 2 is partitioned into a central portion, a middle portion and an outer portion and each portion is individually controlled, the illumination distribution on the substrate 2 becomes uniform, so that the entire surface of the substrate 2 can be uniformly heated with higher accuracy.

Furthermore, with respect to the peltier elements 21 of the thermoelectric conversion unit 12, if the substrate 2 is also partitioned into, e.g., a central portion, a middle portion and an outer portion and each portion is individually temperature-controlled, the front surface of the substrate 2 can be uniformly heated with even higher accuracy.

If the lamp annealing process of the substrate 2 is completed, in order to lower the temperature of the substrate 2 at high rate, an electric current flows through the peltier element 21 in an opposite direction to that in the heating mode of the substrate 2 to cool the top surface thereof. Accordingly, the mounting table 11 is cooled to rapidly cool the substrate 2. Warming heat is generated from the bottom surface of the peltier element 21, if the top surface thereof is cooled. Therefore, by flowing cooling water through the heat transfer medium path 26, the bottom surface of the peltier element 21 is cooled down. The cooling water is supplied to the heat transfer medium path 26 almost at the same time as changing the electric current direction of the peltier element 21. Further, if the temperature of the substrate 2 is lowered to a predetermined temperature, the gate valve 18 is opened and the substrate 2 annealed in the treatment room 10 is unloaded from the chamber 3 to the outside, and the heat treatment process of the substrate 2 is completed.

As described above, in accordance with the heat treating device 1 of the present embodiment, the light loss is significantly reduced compared to the conventional device. Further, since most light emitted from the light source 15 can be led to the substrate 2, the substrate 2 can be heated to a predetermined processing temperature at high rate, whereby heating efficiency can be improved. In addition, since the heating efficiency is improved, a large electric current does not have to flow through the filament 15*a* of the light source 15, thereby improving the durability of the light source 15.

Furthermore, although the reflective surface 41 of the second reflector 37 has been described to be a spheroidal surface in the present embodiment, it is not limited thereto and may be a curved surface approximate to the spheroidal surface, e.g., a rotation paraboloid.

Further, the substrate 2 is not limited to the silicon wafer, and a glass substrate for a liquid crystal display (LCD substrate) may be used.

Moreover, although the above preferred embodiment has been described with respect to the heat treating device used for ion activation, the present invention is not limited thereto and it may also be applied to various heat treating devices for performing numerous processes such as a film forming process, a pattern etching process or the like.

What is claimed is:

1. A heat treating device comprising:
    a treatment room for accommodating therein a substrate;
    a plurality of light sources, which is disposed above the treatment room, for irradiating the substrate;
    a first reflector, whose inner surface is a reflective surface of a dome shape, for reflecting and directing a part of light emitted from each of the light sources to the substrate; and
    a plurality of second reflectors, each of which is provided for each of the light sources, for reflecting and focusing light emitted from each of the light sources and directing the emitted light to the substrate,
    wherein a reflective surface of each of the second reflectors is a part of a spheroidal surface surrounding a first focal point in such a manner that the first focal point is formed at a position near each light source and a second focal point is formed on a side of the substrate.

2. The heat treating device of claim 1, wherein the reflective surface of the first reflector is of a hemispherical shape and the light sources are disposed outside the reflective surface of the first reflector on the almost entire surface of the first reflector.

3. The heat treating device of claim 1, wherein the second reflectors are disposed at respective tilt angles adjusted with respect to an optical axis of the first reflector in such a manner that lights emitted from the respective light sources and then reflected by the reflective surfaces of the respective second reflectors are irradiated on respective specific irradiation areas of the substrate to be processed without crossing each other.

4. The heat treating device of claim 2, wherein the second reflectors are disposed at respective tilt angles adjusted with respect to an optical axis of the first reflector in such a manner that lights emitted from the respective light sources and then reflected by the reflective surfaces of the respective second reflectors are irradiated on respective specific irradiation areas of the substrate to be processed without crossing each other.

5. The heat treating device of claim 1, wherein the reflective surface of the first reflector is of a hemispherical shape, and
    wherein a radius R of the first reflector is defined as:

$$R = \sqrt{\frac{S}{2\pi}}$$

where $S = n\pi r^2 + \alpha$, r is a radius of one of the second reflectors, n is the number of the light sources, and $\alpha$ is a constant.

6. The heat treating device of claim 5, wherein the second reflectors are disposed at respective tilt angles adjusted with respect to an optical axis of the first reflector in such a manner that lights emitted from the respective light sources and then reflected by the reflective surfaces of the respective second reflectors are irradiated on respective specific irradiation areas of the substrate to be processed without crossing each other.

* * * * *